United States Patent
Sun et al.

(10) Patent No.: US 11,309,995 B2
(45) Date of Patent: Apr. 19, 2022

(54) PARALLEL CHANNEL SKEW FOR ENHANCED ERROR CORRECTION

(71) Applicant: CREDO TECHNOLOGY GROUP LIMITED, Grand Cayman (KY)

(72) Inventors: Junqing Sun, Fremont, CA (US); Haoli Qian, Fremont, CA (US)

(73) Assignee: CREDO TECHNOLOGY GROUP LIMITED, Grand Cayman (KY)

( * ) Notice: Subject to any disclaimer, the term of this patent is extended or adjusted under 35 U.S.C. 154(b) by 217 days.

(21) Appl. No.: 16/793,746

(22) Filed: Feb. 18, 2020

(65) Prior Publication Data

US 2021/0013998 A1    Jan. 14, 2021

(30) Foreign Application Priority Data

Jul. 11, 2019    (CN) .......................... 201910633052.5

(51) Int. Cl.
*H04L 1/00*    (2006.01)
*H03M 9/00*    (2006.01)
(Continued)

(52) U.S. Cl.
CPC ............ *H04L 1/0061* (2013.01); *H03M 9/00* (2013.01); *H04L 1/0041* (2013.01);
(Continued)

(58) Field of Classification Search
CPC ... H04L 1/0061; H04L 1/0041; H04L 25/026; H04L 25/0272; H04L 25/03872; H03M 9/00
See application file for complete search history.

(56) References Cited

U.S. PATENT DOCUMENTS

2009/0182918 A1* 7/2009 Hollis ..................... H03M 5/00
                                                710/106
2013/0170579 A1* 7/2013 Nishioka ............... H04L 1/0057
                                                375/295
(Continued)

OTHER PUBLICATIONS

IEEE P802.3cd™/D3.3; "Draft Standard for Ethernet Amendment 3: Media Access Control Parameters for 50 Gb/s and Physical Layers and Management Parameters for 50 Gb/s, 100 Gb/s, and 200 Gb/s Operation" Jun. 5, 2018, The Institute of Electrical and Electronics Engineers, Inc.

*Primary Examiner* — Kyle Vallecillo
(74) *Attorney, Agent, or Firm* — Ramey LLP

(57) ABSTRACT

Digital communication transmitters, systems, and methods can introduce skew into parallel transmission channels to enhance the performance of forward error correction (FEC) decoders. One illustrative serializer-deserializer (SerDes) transmitter embodiment includes: a block code encoder configured to convert a sequence of input data blocks into a sequence of encoded data blocks; a demultiplexer configured to distribute code symbols from the sequence of encoded data blocks to multiple lanes in a cyclical fashion, the multiple lanes corresponding to parallel transmission channels; a skewer configured to buffer the multiple lanes to provide respective lane delays, the lane delays differing from each other by no less than half an encoded data block period; and multiple drivers, each driver configured to transmit code symbols from one of said multiple lanes on a respective one of said parallel transmission channels.

20 Claims, 7 Drawing Sheets

(51) Int. Cl.
*H04L 25/02* (2006.01)
*H04L 25/03* (2006.01)

(52) U.S. Cl.
CPC ........ *H04L 25/026* (2013.01); *H04L 25/0272* (2013.01); *H04L 25/03872* (2013.01)

(56) References Cited

U.S. PATENT DOCUMENTS

2016/0028534 A1* 1/2016 Sengoku ............... H04L 7/0008
 375/355
2019/0073332 A1* 3/2019 Amiri ................. G06F 13/4208

* cited by examiner

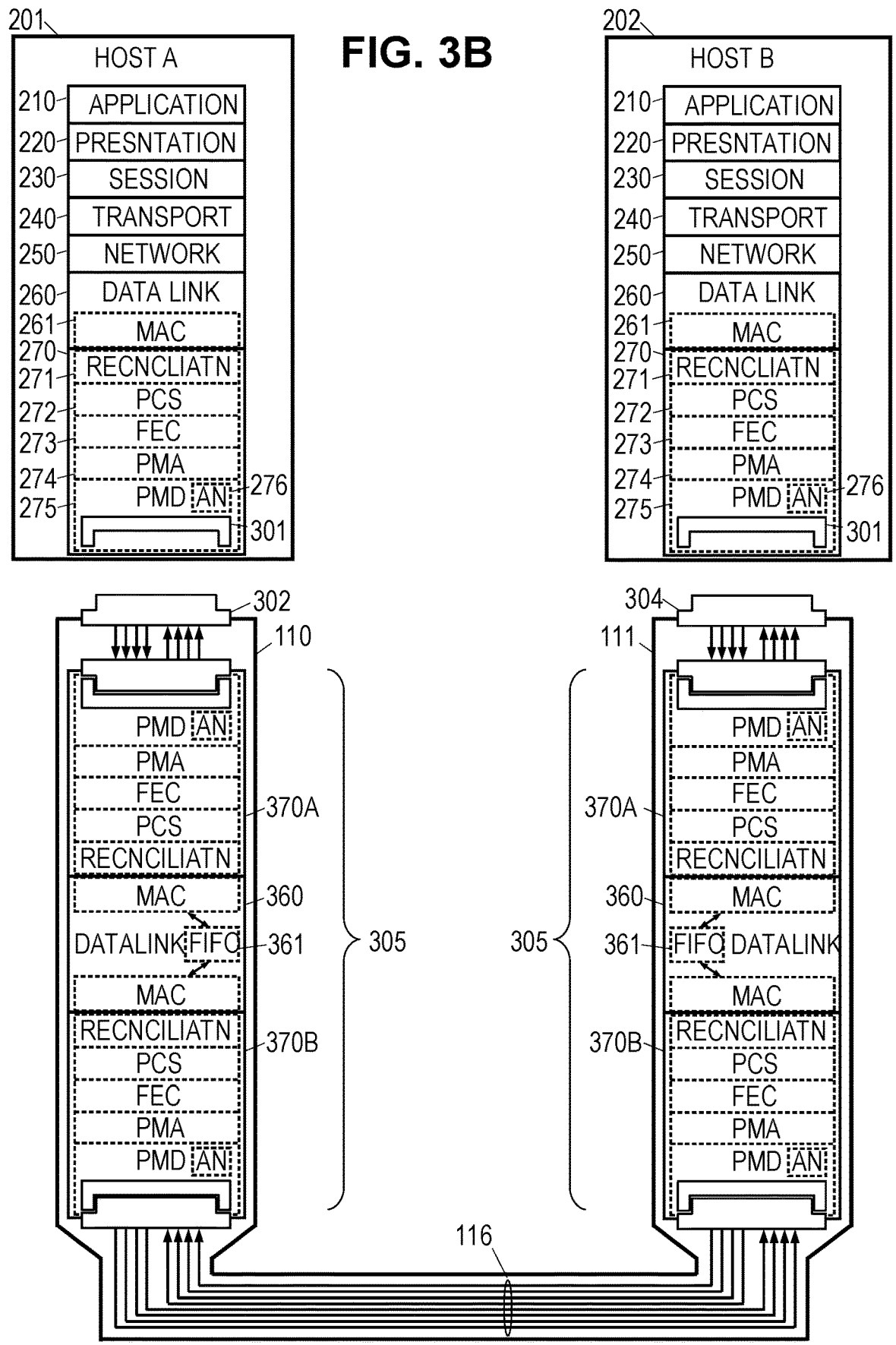

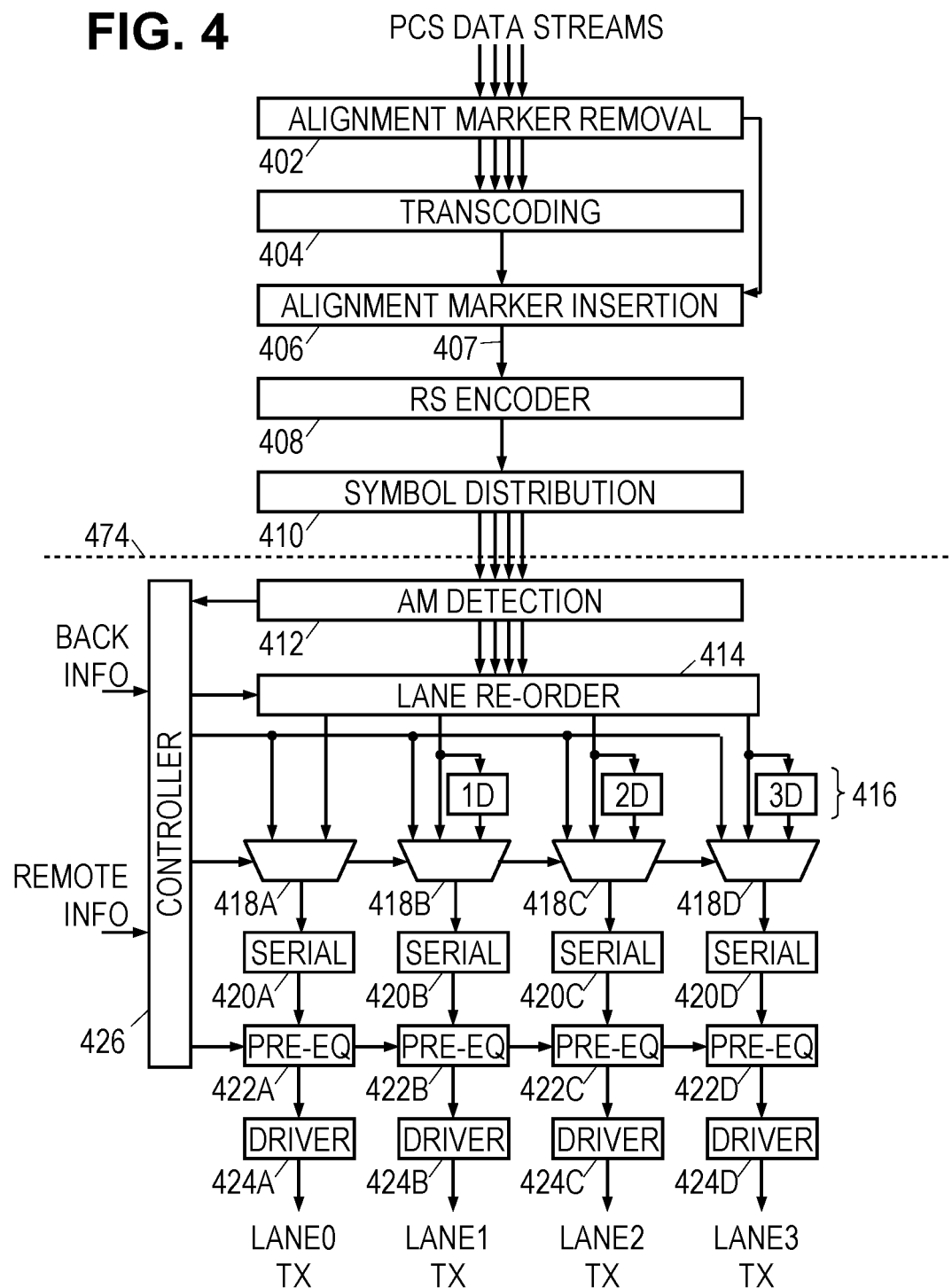

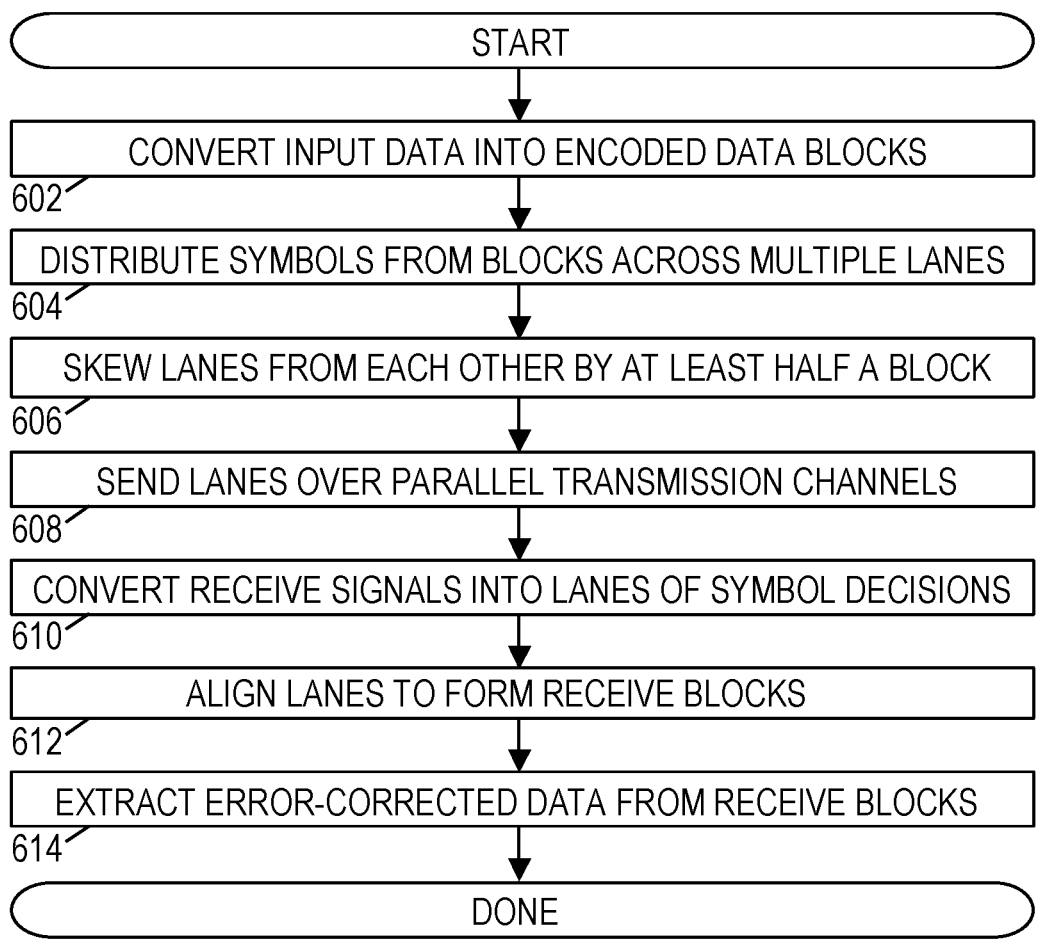

PARALLEL CHANNEL SKEW FOR ENHANCED ERROR CORRECTION

BACKGROUND

The Institute of Electrical and Electronics Engineers (IEEE) Standards Association publishes an IEEE Standard for Ethernet, IEEE Std 802.3-2015, which will be familiar to those of ordinary skill in the art to which this application pertains. This standard provides a common media access control specification for local area network (LAN) operations at selected speeds from 1 Mb/s to more than 100 Gb/s with various channel signal constellations over coaxial cable, twin-axial cable, fiber optic cable, electrical backplanes, and other physical media. As demand continues for ever-higher data rates, the standard is being extended. Such extensions to the standard must account for increased channel attenuation and dispersion even as the equalizers are forced to operate at faster symbol rates. It is becoming increasingly difficult to provide affordable, mass-manufactured network hardware that assures consistently robust performance as the proposed per-lane bit rates rise beyond 50 Gbps with PAM4 or larger signal constellations.

SUMMARY

Accordingly, there are disclosed herein digital communication transmitters, systems, and methods that introduce skew into parallel transmission channels to enhance the performance of forward error correction (FEC) decoders. One illustrative serializer-deserializer (SerDes) transmitter embodiment includes: a block code encoder configured to convert a sequence of input data blocks into a sequence of encoded data blocks; a demultiplexer configured to distribute code symbols from the sequence of encoded data blocks to multiple lanes in a cyclical fashion, the multiple lanes corresponding to parallel transmission channels; a skewer configured to buffer the multiple lanes to provide respective lane delays, the lane delays differing from each other by no less than half an encoded data block period; and multiple drivers, each driver configured to transmit code symbols from one of said multiple lanes on a respective one of said parallel transmission channels.

An illustrative method embodiment includes: encoding a sequence of input data blocks into a sequence of encoded data blocks; distributing the sequence of encoded data blocks in symbol-by-symbol fashion across multiple lanes corresponding to parallel transmission channels; buffering the multiple lanes to provide respective lane delays, the lane delays differing from each other by no less than half an encoded data block period; and driving the parallel transmission channels each with symbols from a respective one of the multiple lanes.

An illustrative embodiment of an active Ethernet cable (AEC) includes electrical conductors joining a first transceiver to a second transceiver to provide parallel transmission channels therebetween, each of the first and second transceivers having: a block code encoder configured to convert a sequence of input data blocks into a sequence of encoded data blocks; a demultiplexer configured to distribute code symbols from the sequence of encoded data blocks to multiple lanes in a cyclical fashion; a skewer configured to buffer the multiple lanes to provide respective lane delays, the lane delays differing from each other by no less than half an encoded data block period; and multiple drivers each configured to transmit code symbols from one of said multiple lanes on a respective one of said parallel transmission channels. Each of the first and second transceivers may further include: multiple receivers each configured to convert a receive signal from a respective one of said transmission channels into a sequence of channel symbols; an alignment module configured to align the multiple sequences of channel symbols using alignment markers to form a sequence of received data blocks; and a block code decoder configured to convert the received data blocks into a sequence of output data blocks.

Each of the foregoing embodiments may be implemented individually or in combination, and may be implemented with any one or more of the following features in any suitable combination: 1. each of the first and second transceivers further includes a deskewer preceding the alignment module, the deskewer being configured to buffer the multiple sequences of channel symbols by predetermined amounts to compensate for the lane delays provided by the skewer. 2. the lane delays correspond to integer multiples of a base delay amount. 3. the base delay amount is an encoded data block period. 4. the multiple lanes comprise four lanes. 5. the block code encoder is a Reed-Solomon encoder. 6. the code symbols each comprise 10 bits. 7. each driver transmits the code symbols as a sequence of NRZ channel symbols. 8. each driver transmits the code symbols as a sequence of PAM4 channel symbols. 9. converting receive signals from the multiple lanes into multiple sequences of channel symbols; buffering the multiple sequences by predetermined amounts to compensate for said respective lane delays; using alignment markers to align the multiple sequences to form a sequence of received data blocks; and decoding the sequence of received data blocks into a sequence of output data blocks.

BRIEF DESCRIPTION OF THE DRAWINGS

FIG. 3B is an architecture diagram of an illustrative communications link including an AEC.

FIG. 4 is a block diagram of a transmit chain in an illustrative multi-lane transceiver.

FIG. 6 is a flowchart of an illustrative multi-lane communications method.

DETAILED DESCRIPTION

Figure 1A:
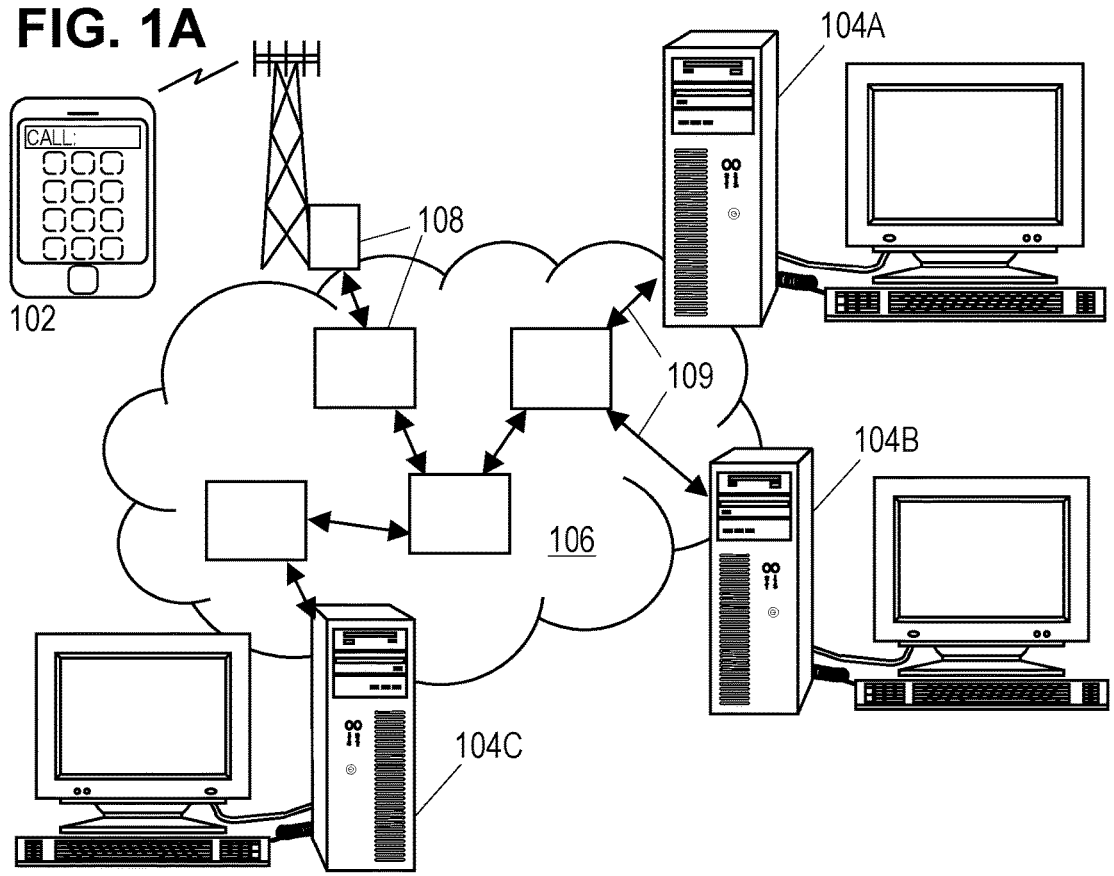
FIG. 1A is a block diagram of an illustrative communications network.

While specific embodiments are given in the drawings and the following description, keep in mind that they do not limit the disclosure. On the contrary, they provide the foundation for one having ordinary skill in the art to discern the alternative forms, equivalents, and modifications within the scope of disclosure and which may be encompassed within the scope of the appended claims.

The disclosed apparatus and methods are best understood in the context of the larger environments in which they operate. Accordingly, FIG. 1A shows an illustrative communications network 100 including mobile devices 102 and computer systems 104A-C coupled via a routing network 106. The routing network 106 may be or include, for example, the Internet, a wide area network, or a local area network. In FIG. 1, the routing network 106 includes a network of equipment items 108, such as switches, routers, and the like. The equipment items 108 are connected to one another, and to the computer systems 104A-C, via point-to-point communication links 109 that transport data between the various network components. At least some of the links 109 in network 106 are high-bandwidth multi-lane links such as Ethernet links operating in compliance with the IEEE Std 802.3-2015 (or later) at 10 Gb/s or more.

Figure 1B:
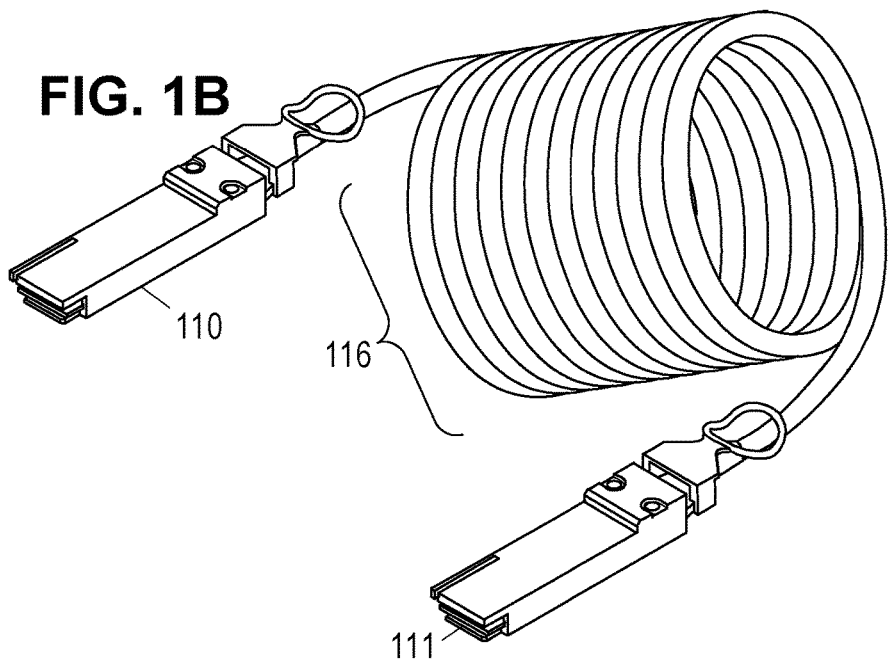
FIG. 1B is a perspective view of an illustrative Active Ethernet Cable (AEC).

FIG. 1B is a perspective view of an illustrative cable that may be used to provide the high-bandwidth multi-lane communications links between 109. The cable includes a first cable end connector 110 and a second cable end connector 111 that are electrically connected via a cord 116. The cord 116 includes electrically conductive wires usually in a paired form such as with twinaxial conductors. Twinaxial conductors can be likened to coaxial conductors, but with two inner conductors instead of one. The inner conductors may be driven with a differential signal, relying on their shared shield to reduce crosstalk with other twinaxial conductors in the cable. Depending on the performance criteria, it may be possible to employ other paired or single-ended conductor implementations.

The conductors may be soldered to pads on a small printed circuit board or similar substrate having traces that connect the pads to one or more integrated circuit chips or multi-chip modules, which in turn are connected by traces to contacts in the cable end connectors. The cable end connectors are configured to mate with network interface ports to receive and send inbound and outbound data streams. Pursuant to the Ethernet standard, each conductor pair in cord 116 may provide unidirectional transport of a differential signal. To enable robust performance over even extended cable lengths (greater than, say, 3 m, 6 m, or 9 m), the cable may be an Active Ethernet Cable (AEC), with each connector 110, 111 including a powered transceiver that performs clock and data recovery (CDR) and re-modulation of data streams in each direction. Notably, the transceivers perform CDR and re-modulation not only of the outbound data streams as they exit the cable, but also of the inbound data streams as they enter the cable.

It is acknowledged here that the inbound data streams may be expected to be compliant with the relevant standard and may be expected to have experienced essentially no deterioration from their traversal of the network interface port's socket pins and the cable assembly's connector plug pins. Nevertheless, the modulation quality and equalization strategy employed by the electronics manufacturer of the transmitting network interface is generally unknown and the minimum requirements of the standard may be inadequate for transport over an extended cable length, particularly if the electronics manufacturer of the receiving network interface is different than that of the transmitting network interface. As with the transmitting network interface, the equalization and demodulation strategy employed by the electronics manufacturer of the receiving network interface is generally unknown and may be unable to cope with the attenuation and interference caused by signal transport over an extended cable length. By performing CDR and re-modulation of both inbound and outbound data streams, the illustrative cable enables consistently robust data transfer over extended cable lengths to be assured without consideration of the electronics manufacturers of the network interfaces.

Figure 2A:
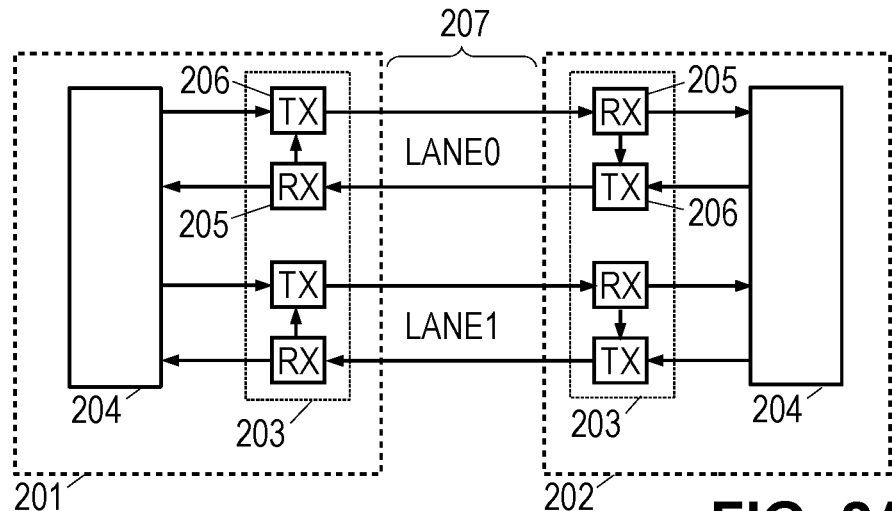
FIG. 2A is a block diagram of an illustrative multi-lane communications link.
Figure 2B:
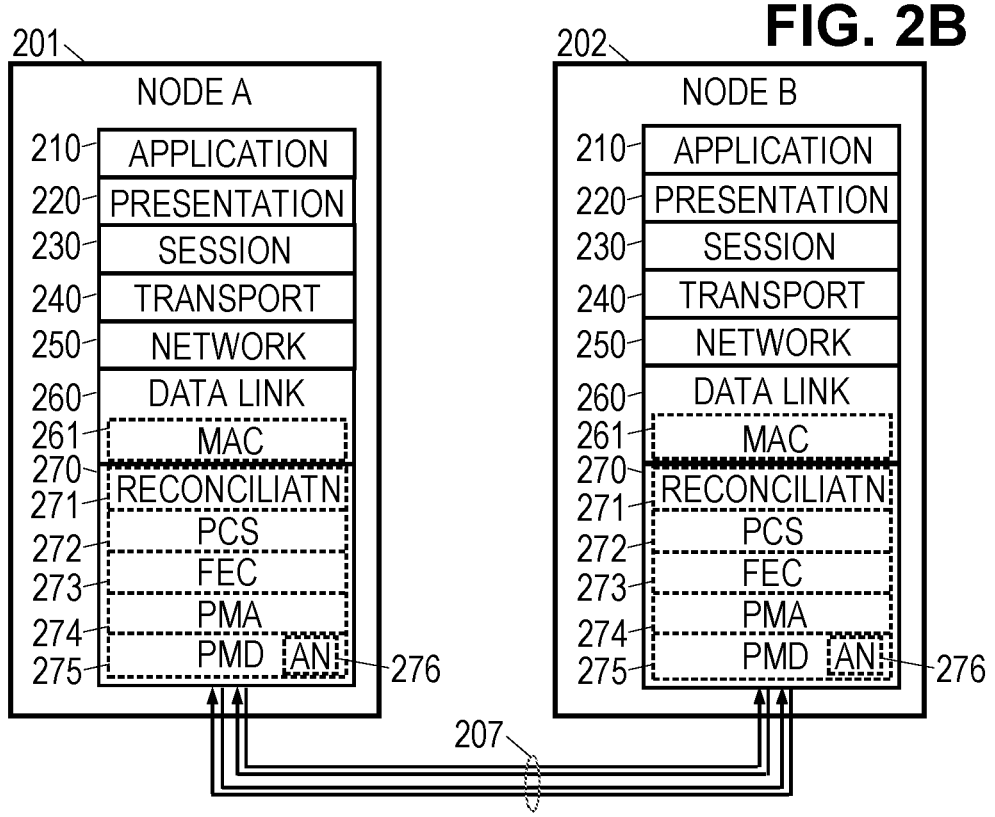
FIG. 2B is an architecture diagram of an illustrative multi-lane communications link.

FIG. 2A is a block diagram of an illustrative two-lane communications link between two nodes 201, 202 representing those portions of network equipment items 108 that implement the Data Link Layer 260 and Physical Layer 270 (discussed further below). Transceivers 203 for multiple transmit and receive channels are each coupled to a host interface 204. The transceivers 203 and host interface 204 may be, e.g., part of a peripheral network interface coupled to the I/O bus of a personal computer, server, network switch, or other network-connected electronic system. The host interface 204 may take the form of a hardwired or firmware-configured application-specific integrated circuit (ASIC) that implements the MAC Sublayer 261, optional Reconciliation Sublayer 271, and PCS Sublayer 272, and elements of the FEC, PMA, and PMD Sublayers 273-275 (discussed below with reference to FIG. 2B), to enable high-rate processing and data transmission. The illustrated transceivers 203, preferably embodied as a hardwired ASIC for very high-rate serial data transmission and reception (aka serialization-deserialization or "SerDes"), include multiple pairs of a receiver 205 and transmitter 206, each pair coupled to two unidirectional channels (a receive channel and a transmit channel) to implement one lane of a multi-lane physical connection 207. The physical connection 207 thus accepts from each node transmit channel signals representing a multi-lane transmit stream and conveys the signals to the other node, delivering them as receive channel signals representing a multi-lane receive data stream. The receive signals may be degraded due to the physical channel's introduction of noise, attenuation, and signal dispersion.

The illustrative link of FIG. 2A is passive, i.e., without intervening components that are powered to boost or regenerate the signals traversing the multi-lane connection 207. In at least some embodiments, the components operate in accordance with the ISO/IEC Model for Open Systems Interconnection (See ISO/IEC 7498-1:1994.1) to communicate over a physical medium. The interconnection reference model employs a hierarchy of layers with defined functions and interfaces to facilitate the design and implementation of compatible systems by different teams or vendors. While it is not a requirement, it is expected that the higher layers in the hierarchy will be implemented primarily by software or firmware operating on programmable processors while the lower layers may be implemented as ASIC hardware.

The Application Layer 210 is the uppermost layer in the model, and it represents the user applications or other software operating on different systems (e.g., equipment 108), which need a facility for communicating messages or data. The Presentation Layer 220 provides such applications with a set of application programming interfaces (APIs) that provide formal syntax, along with services for data transformations (e.g., compression), establishing communication sessions, connectionless communication mode, and negotiation to enable the application software to identify the available service options and select therefrom. The Session Layer 230 provides services for coordinating data exchange including: session synchronization, token management, full- or half-duplex mode implementation, and establishing, managing, and releasing a session connection. In connectionless mode, the Session Layer may merely map between session addresses and transport addresses.

The Transport Layer 240 provides services for multiplexing, end-to-end sequence control, error detection, segmenting, blocking, concatenation, flow control on individual connections (including suspend/resume), and implementing end-to-end service quality specifications. The focus of the Transport Layer 240 is end-to-end performance/behavior. The Network Layer 250 provides a routing service, determining the links used to make the end-to-end connection and when necessary acting as a relay service to couple together such links. The Data link layer 260 serves as the interface to physical connections, providing delimiting, synchronization, sequence and flow control across the physical connection. It may also detect and optionally correct errors that occur across the physical connection. The Physical layer 270 provides the mechanical, electrical, functional, and procedural means to activate, maintain, and deactivate channels on connection 207, and means to use the channels for transmission of bits across the physical media. Commercial and open source software, drivers, and firmware libraries are widely available to implement the foregoing model layers.

The Data Link Layer 260 and Physical Layer 270 are subdivided and modified slightly by IEEE Std 802.3-2015, which provides a Media Access Control (MAC) Sublayer 261 in the Data Link Layer 260 to define the interface with the Physical Layer 270, including a frame structure and transfer syntax. Within the Physical Layer 270, the standard provides a variety of possible subdivisions such as the one illustrated in FIG. 2B, which includes an optional Reconciliation Sublayer 271, a Physical Coding Sublayer (PCS) 272, a Forward Error Correction (FEC) Sublayer 273, a Physical Media Attachment (PMA) Sublayer 274, a Physical Medium Dependent (PMD) Sublayer 275, and an optional Auto-Negotiation (AN) Sublayer 276, which is shown here as part of the PMD sublayer 275.

If present, the optional Reconciliation Sublayer 271 merely maps between interfaces defined for the MAC Sublayer 261 and the PCS Sublayer 272. The PCS Sublayer 272 provides scrambling/descrambling, data encoding/decoding (with a transmission code that enables clock recovery and bit error detection), multi-lane block and symbol redistribution, PCS alignment marker insertion/removal, and block-level lane synchronization and deskew. To enable bit error rate estimation by components of the Physical Layer 270, the PCS alignment markers typically include Bit-Interleaved-Parity (BIP) values derived from the preceding bits in the lane up to and including the preceding PCS alignment marker.

The FEC Sublayer 273 provides, e.g., Reed-Solomon coding/decoding that distributes data blocks with controlled redundancy across the lanes to enable error correction. In some embodiments (e.g., in accordance with Article 91 or proposed Article 134 for the IEEE Std 802.3), the FEC Sublayer 273 modifies the number of lanes. For example, under proposed Article 134, a four-lane outgoing data stream (including PCS alignment markers) may be converted into a two-lane transmit data stream. Conversely, the FEC Sublayer 273 may convert a two-lane receive data stream into a four-lane incoming data stream. In both directions, the PCS alignment markers may be preserved, yielding pairs (or more generally, "sets") of grouped PCS alignment markers in the multi-lane data streams being communicated to and from the PMA Sublayer 230. (Article 91 provides for a 20-to-4 lane conversion, yielding sets of 5 grouped PCS alignment markers in each lane of the data streams communicated between the FEC and PMA sublayers.)

The PMA Sublayer 274 provides lane remapping, symbol encoding/decoding, framing, and octet/symbol synchronization. The PMD Sublayer 275 specifies the transceiver conversions between transmitted/received channel signals and the corresponding bit (or digital symbol) streams. If present, the optional AN Sublayer 276 implements an initial start-up of the communications channels, conducting an auto-negotiation phase and a link-training phase before entering a normal operating phase. The auto-negotiation phase enables the end nodes to exchange information about their capabilities, and the training phase enables the end nodes to adapt both transmit-side and receive-side equalization filters in a fashion that combats the channel non-idealities.

Figure 3A:
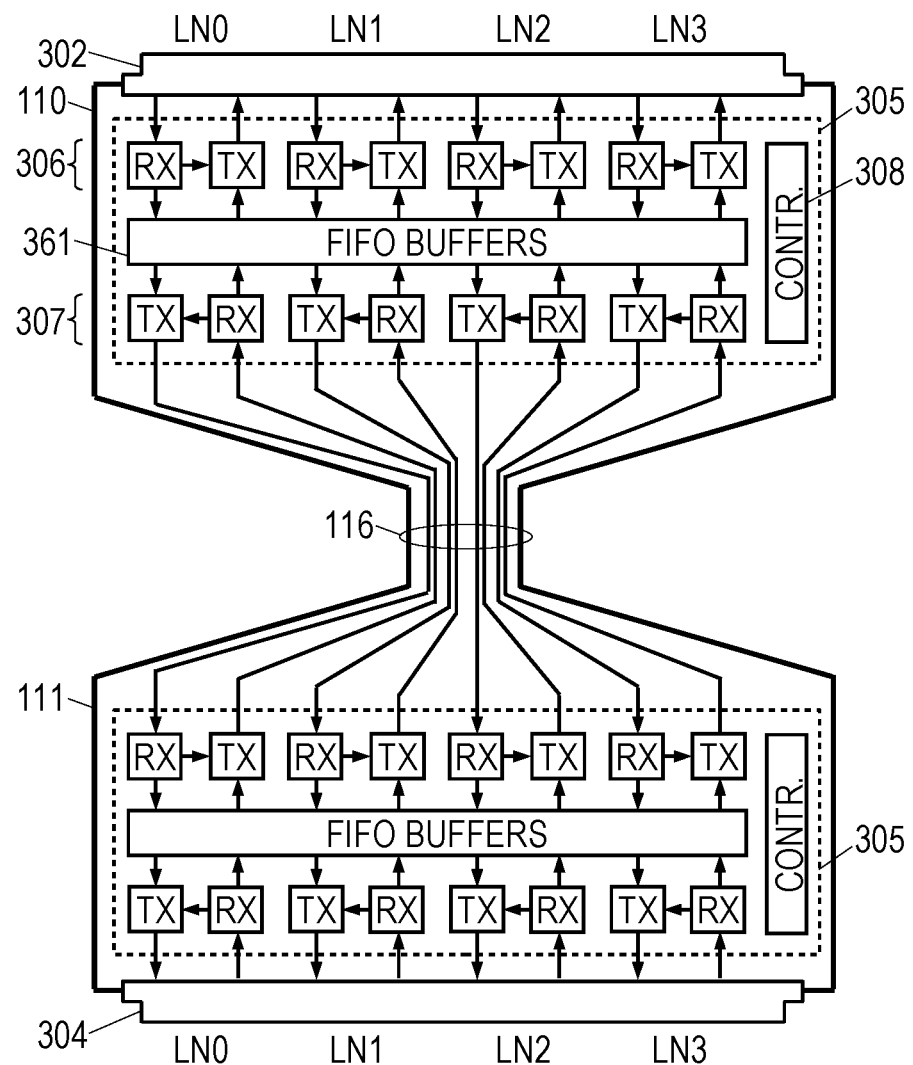
FIG. 3A is a block diagram of an illustrative AEC.

FIG. 3A is a function-block diagram of the illustrative cable of FIG. 1B. Connector 110 includes a plug 302 adapted to fit a standard-compliant Ethernet port in a first host device 201 (FIG. 3B) to receive an inbound data stream as an electrical input signal from the host device and to provide an outbound data stream as an electrical output signal to the host device. Similarly, connector 111 includes a plug 304 that fits an Ethernet port of a second host device 202. Connector 110 includes a first transceiver 305 to perform CDR and re-modulation of the data streams entering and exiting the cable at connector 110, and connector 111 includes a second transceiver 305 to perform CDR and re-modulation of the data streams entering and exiting the cable at connector 111. The transceivers 305 may be integrated circuits mounted on a printed circuit board and connected to plug pins via circuit board traces. The wires of cord 116 may be soldered to corresponding pads on the printed circuit board.

Each transceiver 305, includes a set 306 of transmitters and receivers for communicating with the host device and a set 307 of transmitters and receivers for sending and receiving via conductor pairs running the length of the cable. The illustrated cable supports four bidirectional communication lanes LN0-LN3, each bidirectional lane formed by two unidirectional connections, each unidirectional connection having a differentially-driven twinaxial conductor pair (with a shield conductor not shown here). The transceivers optionally include a memory 361 to provide first-in first-out (FIFO) buffering between the transmitter & receiver sets 306, 307. A controller 308 coordinates the operation of the transmitters and receivers by, e.g., setting initial equalization parameters and ensuring the training phase is complete across all lanes and links before enabling the transmitters and receiver to enter the data transfer phase.

In at least some contemplated embodiments, the host-facing transmitter and receiver set 306 employ fixed equalization parameters that are cable-independent, i.e., they are not customized on a cable-by-cable basis. The center-facing transmitter and receiver set 307 preferably employ cable-dependent equalization parameters that are customized on a cable-by-cable basis. The cable-dependent equalization parameters may be adaptive or fixed, and initial values for these parameters may be determined during manufacturer tests of the cable. The equalization parameters may include filter coefficient values for pre-equalizer filters in the transmitters, and gain and filter coefficient values for the receivers.

The illustrative cable of FIG. 3A may be a part of an active communications link between two host devices 201, 202 as shown in the architectural diagram of FIG. 3B. Devices 201, 202 include the layers and sublayers previously described with respect to FIG. 2B, with the addition of network interface port sockets 301 as part of PMD sublayer 275. Connector plugs 302, 304 mate with the port sockets 301, connecting the interface port transceivers to the transceivers 305 in the cable end connectors 110, 111. Transceivers 305 each implement a host-facing Physical Layer 370A, a center-facing Physical Layer 370B, and a Data Link Layer 360 that bridges together the two Physical Layers 370A, 370B. Data Link Layer 360 includes a first-in first-out (FIFO) buffer memory 361, and may include optional MAC sublayers for interfacing with the Physical Layers 370A, 370B. Omission of the optional MAC sublayers is contemplated as a way to reduce areal requirements, reduce power consumption, and increase efficiency. For similar reasons, the optional Reconciliation Sublayer may be omitted from each of the Physical Layers 370A, 370B. In some contemplated embodiments, the PCS sublayers interface directly with the FIFO buffer memory 361. In other contemplated embodiments, the PCS sublayers are bypassed, simplified, or omitted to enable the FEC sublayers to interface more or less directly with the FIFO. In still other contemplated embodiments, the FEC sublayers are merged and provided with integrated FIFO buffering capability. In each case there exists the potential for increased efficiency.

More information regarding the operation of the sublayers, as well as the electrical and physical specifications of the connections between the nodes and the communications medium (e.g., pin layouts, line impedances, signal voltages & timing), and the electrical and physical specifications for the communications medium itself (e.g., conductor arrangements in copper cable, limitations on attenuation, propagation delay, signal skew), can be found in the current Ethernet standard, and any such details should be considered to be well within the knowledge of those having ordinary skill in the art. The discussion below focuses on modifications specific to the present disclosure.

Figure 5:
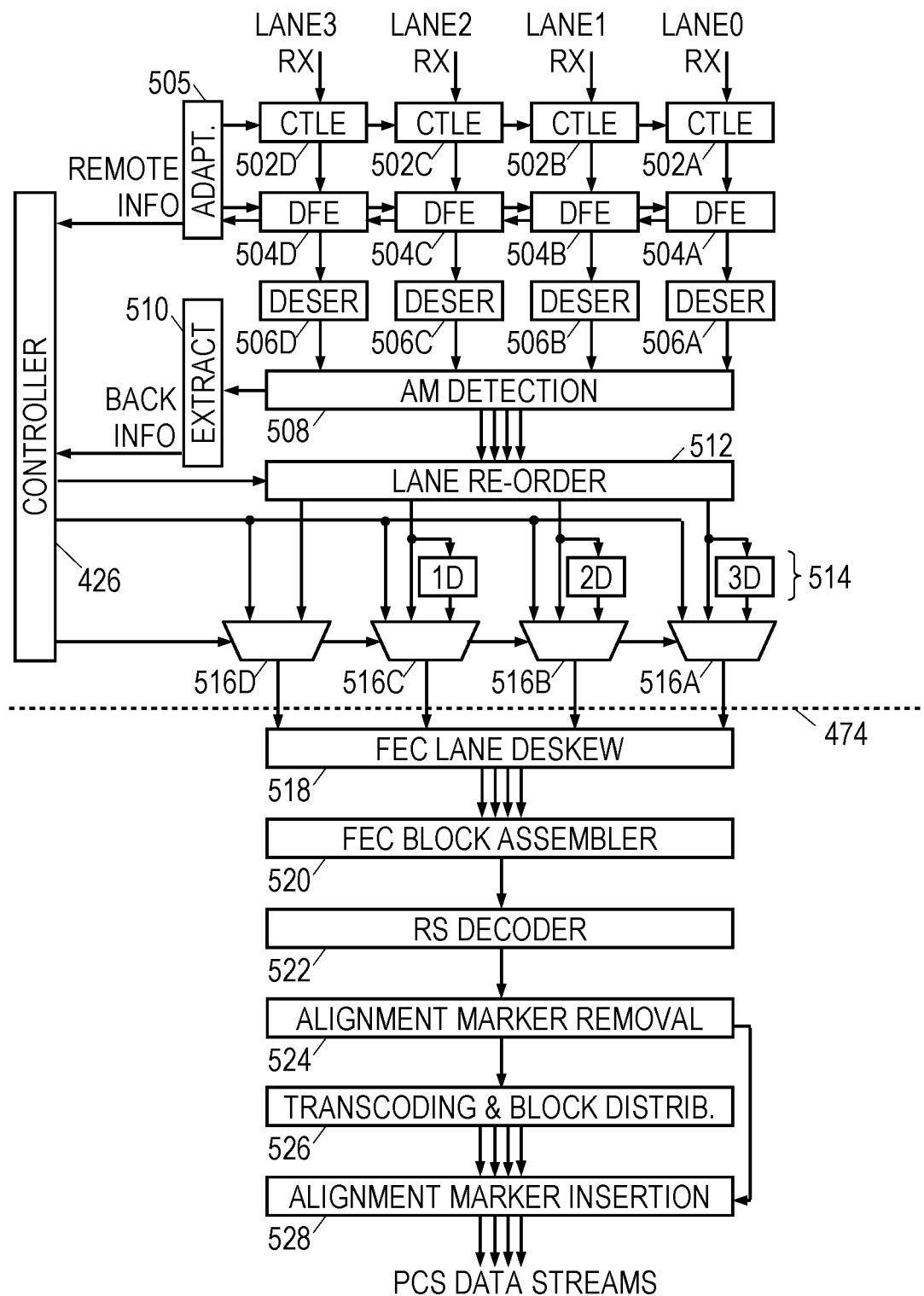
FIG. 5 is a block diagram of a receive chain in an illustrative multi-lane transceiver.

The PMA and PMD Sublayers in the devices 201, 202, and in the transceivers 305, may be implemented by the receiver and transmitter sets 203, 306, 307. FIGS. 4 and 5 are block diagrams of an illustrative transmit chain and receive chain contemplated for implementing each of the receivers and transmitters in the sets 203, 306, 307.

The transmit chain in FIG. 4 accepts a four-lane data stream from the PCS, though it should be noted that the number of lanes is a design parameter that can be altered. Pursuant to the standard, the PCS data stream is already encoded with a transmission code that provides DC balance and enables timing recovery. The PCS data stream lanes further include PCS alignment markers for synchronizing the lanes with each other. In many cases the lanes will already be aligned by virtue of the design, but if not a lane synchronization module will be provided for this purpose. Once the data stream lanes are aligned, an alignment marker removal module 402 removes the alignment markers from each lane, passing them to a downstream alignment marker insertion module 406. A transcoding module 404 modifies the transmission code from a 64b/66b code to a 256b/257b code more appropriate for use with the Reed-Solomon encoder. By repeatedly transcoding four 66-bit blocks taken in parallel from the four incoming lanes into individual 257-bit blocks, the transcoding module may essentially convert the four lanes into a single lane data stream.

The previously-mentioned alignment marker insertion module 406 accepts the PCS alignment marker information from removal module 402 and the single-lane data stream from transcoding module 404. The insertion module 406 combines the alignment marker information from the four lanes to form a set of grouped alignment markers in a 257-bit block and, accounting for the operation of the transcoding module 404, inserts the alignment marker block in a fashion that preserves its location relative to the other data in the data stream 407. The alignment marker block is designed to account for the operation of the encoder module 408 and symbol distribution module 410 such that the alignment markers appear essentially intact and in order within the multi-lane transmit data stream crossing PMA boundary 474, enabling them to be used for lane re-synchronization downstream. Additional detail can be found in the IEEE Ethernet standard.

A Reed-Solomon (RS) encoder module 408 operates on input blocks of 10-bit "symbols" from the data stream 407 from the insertion module 406, adding redundancy to enable downstream correction of symbol errors. Typically, the encoder module 408 operates to preserve the original data stream content while appending so-called "parity" information, e.g., 30 parity symbol blocks appended to input blocks of 514 data symbols to form a complete code word block or "encoded data block". Thus the alignment marker blocks inserted by module 406 will remain present in the output data-stream from the encoder module. A symbol distribution module 410 distributes code word symbols across multiple transmission lanes in a cyclic fashion, i.e., one 10-bit symbol to the first transmission lane, the next symbol to the second transmission lane, the next symbol to the third transmission lane, the next to the fourth, and then the cycle repeats. Each transmission lane gets directed to a corresponding transmitter. Though four transmission lanes are shown in the present example, the number of lanes is a design parameter that can be altered.

Boundary 474 may be considered as the boundary between the FEC sublayer 228 and the PMA sublayer 230. Where it is desired to maintain this boundary as strongly as possible, the PMA sublayer may include an alignment marker detection module 412 to detect the alignment markers inserted for each lane of the transmit data stream by module 406 with suitable data buffering. Alternatively, this boundary can be relaxed and the alignment marker detection module 412 omitted in favor of appropriate direct signaling from the alignment marker insertion module 406. Among other things, the alignment markers can be used to identify the lane number, thereby enabling a lane re-order module 414 to shift any misplaced lanes in advance of intentional skewing operations. Thus even if symbol distribution module 410, perhaps due to some initialization error, introduces a cyclic shift in the transmission lanes such that Lane 0 is conveying the symbol stream intended for Lane 1, Lane 1 is conveying the symbol stream intended for Lane 2, etc., the Lane Re-order module 414 ensures that the misplacement is corrected.

A set of delay buffers 416 (labeled 1D, 2D, 3D) is provided to introduce a predetermined skew between the data streams traversing the transmission lanes. Preferably, the delay buffers provide integer multiples of a base delay amount. That is, the data stream on Lane 1 is delayed by 1D relative to the data stream on Lane 0. Lane 2 is delayed by 1D relative to Lane 1 and by 2D relative to Lane 0. Lane 3 is delayed by 1D relative to Lane 2, 2D relative to Lane 1, and 3D relative to Lane 0. However, the delays don't have to be integer multiples, so long as the sum of delays for Lanes 0 and 3 equal the sum of the delays for Lanes 1 and 2. As discussed in greater detail below, the delays are chosen to improve the performance of the RS encoder 408.

A controller 426 controls a set of multiplexers 418A through 418D to select between a training data (supplied by the controller 426 during auto-negotiation and training phases), the un-skewed output of the lane re-order module 414, or the skewed outputs of the delay buffers 416. (The term "skewer" may be employed herein to refer to the set of delay buffers 416, alone or in combination with the lane re-order module 414 and multiplexers 418A-418D.) Multiplexers 418A-418D forward the encoded data streams to serializer modules 420A-420D during normal operations, with or without intentional skew as configured by firmware.

During auto-negotiation and training phases, the multiplexers supply negotiation and training data streams from the controller 426 to the serializers. During normal operations in the presence of alignment markers, the multiplexers 418A-418D may act as alignment marker replacement modules, supplying the serializer modules with modified alignment markers as described in U.S. Pat. No. 10,212,260 ("SerDes architecture with a hidden backchannel protocol"). The serializers 420A-420D each accept a stream of transmit data blocks and convert the stream of blocks into a (higher-rate) stream of channel symbols. Where, for example, a 4-PAM signal constellation is used, each serializer may produce a stream of two-bit symbols (binary encoding) or three-bit symbols (thermometer encoding).

Each stream of channel symbols is filtered by a respective pre-equalizer module 422A-422D to produce a transmit signal, which is amplified and supplied to the transmit channel by a corresponding driver 424A-424D. The pre-equalizer modules compensate for at least some of the channel dispersion, reducing or eliminating the need for receiver-side equalization. Such pre-equalization may be advantageous in that it avoids the noise enhancement often associated with receiver-side equalization and enables digital filtering with a reduced bit-width. The bit width reduction directly reduces power consumption by requiring a less complex filter, but may further reduce power consumption by obviating the parallelization that a more complex filter might require to operate at the required bandwidth. However, pre-equalization generally requires knowledge of the channel.

Controller 426 operates to characterize the channel after conducting an initial auto-negotiation phase. During the optional auto-negotiation phase, the controller 426 generates a sequence of auto-negotiation frames conveying capabilities of the local node to the remote node and negotiating to select a combination of features to be used for subsequent communications. When the auto-negotiation phase is complete, each training controller generates a sequence of training frames, so that training is carried out independently on each of the lanes. The controller 426 receives backchannel information extracted by the receiver from the received data stream and use the backchannel information to adjust the coefficients of the pre-equalization filters. The controllers further receive "remote info", which includes locally-generated information for adapting the coefficients of the pre-equalization filter in the remote node. Based on this information the controllers populate the relevant fields of the training frames to provide backchannel information to the remote node. As training frames are employed only during the training phase, and as it may be desirable to continue updating the pre-equalization filter during normal operations, the controller 426 may include similar backchannel information in or with the modified alignment markers supplied via multiplexers 418A-418D during normal operations.

Having discussed the transmit chain and the use of backchannel information during the training and normal operations phases, we turn now to the operation of an illustrative receive chain such as that shown in FIG. 5. The receive chain obtains analog electrical signals from different receive channels (indicated by Lane0-rx through Lane3-rx). These may be obtained directly from electrical conductors, if the physical medium is an electrical bus or cable, or indirectly via transducers if the physical medium is wireless. CTLE filters 502A-502D provide continuous time linear equalization to shape the receive signal spectrum, optionally operating in an adaptive fashion to reduce the length of the channel impulse response while minimizing noise enhancement. Decision feedback equalizers (DFE) 504A-504D operate on the filtered signals to correct for inter-symbol interference and to detect each transmitted channel bit or symbol, thereby producing a demodulated digital data stream. Some embodiments employ oversampling. A clock recovery and adaptation module 505 derives a sampling clock signal from the input and/or output of each DFE's decision element and supplies it back to the DFEs to control timing of the symbol detection. The adaptation module 505 further derives an error signal of the DFE decision element's input relative to the output or (during the training phase) to a known training pattern, and uses the error signal to adapt the DFE coefficient(s) and the response of the CTLE filters. The adaptation module 505 still further uses the error signal to generate "remote info", i.e., adaptation information for the remote pre-equalizers. This remote info is supplied to the controller 426.

Deserializers 506A-506D group the digital receive data stream bits or symbols into blocks to enable the use of lower clock rates for subsequent on-chip operations. An alignment marker detection module 508 monitors the receive data streams to detect the alignment markers and achieve alignment marker lock during normal operations, or during training operations to detect the training frame markers and achieve lock thereto. A backchannel information extraction module 510 extracts the backchannel information from the appropriate portions of the training frames and alignment markers, providing the pre-equalizer adaptation information and status report information to the controller 426.

Based on information from the alignment markers, a lane re-order module 512 ensures that the receive data streams are placed into the correct receive lanes so that any intentional lane skews can be appropriately compensated by a set of delay buffers 514. The set of delay buffers 514 may be essentially the same as set 416 (FIG. 4), rearranged so that the data streams traversing both sets of delay buffers experience the same total delay and thus become unskewed (except for channel delays and other sources of unintended skew effects). The Lane 0 data stream was given no delay in the transmit chain and 3D delay in the receive chain, for a total (added) delay of 3D. The Lane 1 data stream was given 1D delay in the transmit chain 2D of delay in the receive chain for a total delay of 3D. The data streams of Lanes 2 and 3 similarly experience a total added delay of 3D, removing at least the intentional skew between the lanes. Residual skew may be corrected later in module 518.

Controller 426 controls a set of multiplexers 516A-516D to replace any modified alignment markers with replacement PCS alignment markers, thereby hiding the backchannel information fields from the higher layers as described in U.S. Pat. No. 10,212,260. Multiplexers 516A-516D further select between unskewed output of the lane re-order module 512 or the unskewed output of the set of delay buffers 514, depending on whether the transmit chain is employing a skewer. (The term "deskewer" may be employed herein to refer to the set of delay buffers 514, alone or in combination with the lane re-order module 512 and multiplexers 516A-516D.)

As with the transmit chain, the receive chain may impose a hard boundary 474 between the PMA sublayer and the FEC sublayer, or alternatively, the alignment marker detection information may be communicated to the FEC lane deskew module 518. The receive data streams from the multiplexers 516A-516D are aligned by an FEC lane deskew module 518 to remove any residual or unintentional skew between the lanes. We observe here that buffers 514 can be omitted and their deskew function absorbed by FEC lane deskew module 518. This deskew capability may be within the scope of existing receive chain implementations; however, the ability of module 518 to accommodate other sources of skew may be impaired by the introduction of a deliberate skew by the transmit chain. It would therefore be beneficial to either provide buffers 514 or to expand the skew-correcting capability of module 518 when employing a transmit lane skewer as provided herein.

An FEC block assembler 520, multiplexes the lanes on a symbol-by-symbol basis to form a single lane sequence of received code word blocks. An RS decoder module 522 operates on the received code word blocks to detect and correct any symbol errors, removing the FEC coding redundancy (parity symbols) during the decoding process. In similar fashion to the transmit chain, an alignment marker removal module 524 removes the alignment markers from each lane, passing them to a downstream alignment marker insertion module 528. A transcoding module 526 converts the 256b/257b transmission code words into blocks of four 64b/66b transmission code words distributing the 66-bit code word blocks across four PCS lanes. An alignment marker insertion module 528 converts the removed alignment marker information into individual alignment markers having lane-specific UM patterns, and inserts the individual alignment markers at appropriate positions in the four lanes accounting for the operation of the transcoding module 526. The four lane PCS data stream is provided to the higher hierarchy layers of the node for eventual communication of the conveyed data to the destination application. The number of receive lanes and PCS lanes implemented in the receiver are design parameters that match with the numbers chosen for the transmit chain.

The RS encoder 408 introduces redundancy within each code word block to enable the RS decoder 522 to correct symbol errors in the received code word blocks. The IEEE Ethernet standard employs an RS(544,514) code that enables the decoder to correct any combination of up to 15 symbols within each received code word block. If, say, a transient noise event were to cause 16 or more symbol errors to occur within a 544-symbol code word, the decoder would be unable to determine which of the 544 symbols were in error and correct them, causing that portion of the data stream to be lost. Yet at the signaling rates contemplated for the high bandwidth Ethernet standards, it would not be unusual for any one of the parallel transmission channels to have 10 or more symbols in transit on the physical media at any given time. If the transient noise event simultaneously affects multiple transmission channels carrying symbols from a given code word block, the error-correcting capability of the decoder will be exceeded.

The encoded data block period is the length of the code word block on a given lane, e.g., 5440 bits/4 lanes=1360 bits, or about 51 ns at a nominal signaling rate of 26.5625 Gb/s. If the base delay D amount for the set of delay buffers 416 (FIG. 4) equals the encoded data block period, then at any given time the different parallel transmission lanes are conveying symbols from different code word blocks. A transient noise event that simultaneously affects the multiple transmission channels could cause perhaps 10 symbol errors in each of four different code word blocks, a situation that is within the error-correcting capability of the decoder.

Due to the presence of other sources of skew, the base delay D may be chosen to be slightly larger than this value to ensure the symbols of a given code word block traverse only one channel at a time. However, noticeable performance improvements may be observed even at a base delay D amount of half the length of a code word block, as this is enough to redistribute half of the errors in such a burst event to other code word blocks. A similar performance improved can be obtained if half of the lanes can be delayed by a full code word block while the other half are left undelayed; a smaller performance achievement may still be observed if half of the lanes are delayed by half of a code word block. Both of these alternative embodiments offer a reduced requirement for buffering and are also contemplated for implementation.

FIGS. 4 and 5 show the use of four parallel transmission channels, but the principles set forth herein are also applicable to the use of two, eight, sixteen, and other numbers of parallel transmission channels.

FIG. 6 is a flow diagram of the illustrative method. In block 602, a transceiver uses an FEC encoder to convert a sequence of input data blocks into a sequence of encoded data blocks. In block 604, the transceiver distributes symbols from each encoded data block across multiple lanes that correspond to parallel transmission channels in a cable or other physical medium. In block 606, the transceiver buffers the lanes to provide at least some lanes with a different delay ("skew"). In block 608, the transceiver sends the symbols from each lane in parallel over the transmission channels, with the skew acting to at least statistically redistribute some fraction of symbol errors from a burst affecting multiple channels to different encoded data blocks.

On the receive end, the transceiver in block 610 converts receive signals into corresponding lanes of detected symbols. In block 612, the transceiver aligns the lanes to form received data blocks, and in block 614, the transceiver uses an FEC decoder to extract error-corrected data from the receive blocks. Because symbol errors from error bursts are redistributed among multiple data blocks, the error correcting capability of the decoder is enhanced.

Numerous alternative forms, equivalents, and modifications will become apparent to those skilled in the art once the above disclosure is fully appreciated. It is intended that the claims be interpreted to embrace all such alternative forms, equivalents, and modifications that are encompassed in the scope of the appended claims.

What is claimed is:

1. An active cable that comprises electrical conductors joining a first transceiver to a second transceiver to provide parallel transmission channels therebetween, each of the first and second transceivers including:
   a block code encoder configured to convert a sequence of input data blocks into a sequence of encoded data blocks;
   a demultiplexer configured to distribute code symbols from the sequence of encoded data blocks to multiple lanes in a cyclical fashion;
   a skewer configured to buffer the multiple lanes to provide respective lane delays, the lane delays differing from each other by no less than half an encoded data block period; and
   multiple drivers each configured to transmit code symbols from one of said multiple lanes on a respective one of said parallel transmission channels.

2. The active cable of claim 1, wherein each of the first and second transceivers further include:
   multiple receivers each configured to convert a receive signal from a respective one of said transmission channels into a sequence of channel symbols;
   an alignment module configured to align the multiple sequences of channel symbols using alignment markers to form a sequence of received data blocks; and a block code decoder configured to convert the received data blocks into a sequence of output data blocks.

3. The active cable of claim 2, wherein each of the first and second transceivers further includes a deskewer preceding the alignment module, the deskewer being configured to buffer the multiple sequences of channel symbols by predetermined amounts to compensate for the lane delays provided by the skewer.

4. The active cable of claim 1, wherein the lane delays correspond to integer multiples of an encoded data block period.

5. The active cable of claim 4, wherein the multiple lanes comprise four lanes.

6. The active cable of claim 1, wherein the block code encoder is a Reed-Solomon encoder, and the code symbols each comprise 10 bits.

7. The active cable of claim 6, wherein the multiple drivers each transmit the code symbols as a sequence of NRZ channel symbols.

8. The active cable of claim 6, wherein the multiple drivers each transmit the code symbols as a sequence of PAM4 channel symbols.

9. A SerDes transmitter that comprises:
a block code encoder configured to convert a sequence of input data blocks into a sequence of encoded data blocks;
a demultiplexer configured to distribute code symbols from the sequence of encoded data blocks to multiple lanes in a cyclical fashion, the multiple lanes corresponding to parallel transmission channels;
a skewer configured to buffer the multiple lanes to provide respective lane delays, the lane delays differing from each other by no less than half an encoded data block period; and
multiple drivers, each driver configured to transmit code symbols from one of said multiple lanes on a respective one of said parallel transmission channels.

10. The transmitter of claim 9, wherein the block code encoder is a Reed-Solomon encoder, and the code symbols each comprise 10 bits.

11. The transmitter of claim 10, wherein the multiple drivers each transmit the code symbols as a sequence of NRZ channel symbols.

12. The transmitter of claim 10, wherein the multiple drivers each transmit the code symbols as a sequence of PAM4 channel symbols.

13. The transmitter of claim 9, wherein the lane delays correspond to integer multiples of a base delay amount.

14. The transmitter of claim 13, wherein the base delay amount is an encoded data block period.

15. The transmitter of claim 13, wherein the multiple lanes comprise four lanes.

16. A digital communication method that comprises:
encoding a sequence of input data blocks into a sequence of encoded data blocks;
distributing the sequence of encoded data blocks in symbol-by-symbol fashion across multiple lanes corresponding to parallel transmission channels;
buffering the multiple lanes to provide respective lane delays, the lane delays differing from each other by no less than half an encoded data block period; and
driving the parallel transmission channels each with symbols from a respective one of the multiple lanes.

17. The method of claim 16, further comprising:
converting receive signals from the multiple lanes into multiple sequences of channel symbols;
buffering the multiple sequences by predetermined amounts to compensate for said respective lane delays;
using alignment markers to align the multiple sequences to form a sequence of received data blocks; and
decoding the sequence of received data blocks into a sequence of output data blocks.

18. The method of claim 16, wherein the lane delays correspond to integer multiples of a base delay amount.

19. The method of claim 18, wherein the base delay amount is an encoded data block period.

20. The method of claim 18, wherein the multiple lanes comprise four lanes.

* * * * *